US010452053B2

(12) United States Patent
Lalish et al.

(10) Patent No.: US 10,452,053 B2
(45) Date of Patent: Oct. 22, 2019

(54) FABRICATING THREE DIMENSIONAL OBJECTS

(71) Applicant: Microsoft Technology Licensing, LLC, Redmond, WA (US)

(72) Inventors: Emmett Lalish, Seattle, WA (US); Yulin Jin, Redmond, WA (US); Kristofer N. Iverson, Redmond, WA (US); Gheorghe Marius Gheorghescu, Sammamish, WA (US); Xin Tong, Beijing (CN); Yang Liu, Beijing (CN)

(73) Assignee: Microsoft Technology Licensing, LLC, Redmond, WA (US)

( * ) Notice: Subject to any disclaimer, the term of this patent is extended or adjusted under 35 U.S.C. 154(b) by 257 days.

(21) Appl. No.: 15/323,032

(22) PCT Filed: Aug. 29, 2014

(86) PCT No.: PCT/CN2014/085497
§ 371 (c)(1),
(2) Date: Dec. 29, 2016

(87) PCT Pub. No.: WO2016/029424
PCT Pub. Date: Mar. 3, 2016

(65) Prior Publication Data
US 2017/0176979 A1    Jun. 22, 2017

(51) Int. Cl.
*B29C 64/386*    (2017.01)
*G05B 19/4099*    (2006.01)
(Continued)

(52) U.S. Cl.
CPC ........ *G05B 19/4099* (2013.01); *B29C 64/106* (2017.08); *B29C 64/386* (2017.08);
(Continued)

(58) Field of Classification Search
CPC ...... G05B 19/4099; G05B 2219/35134; G05B 2213/49007; G06F 17/50; B33Y 10/00; B33Y 30/00; B33Y 50/00; B33Y 50/02
(Continued)

(56) References Cited

U.S. PATENT DOCUMENTS 5,394,481 A    2/1995   Kumagai et al.
6,021,358 A *   2/2000   Sachs ............... G05B 19/40937
                                            700/118
(Continued)

FOREIGN PATENT DOCUMENTS

CN    101542490 A    9/2009
CN    103761397 A    4/2014
(Continued)

OTHER PUBLICATIONS

International Search Report for PCT Application No. PCT/CN2014/085497 dated Jun. 3, 2015, 4 pages.
(Continued)

*Primary Examiner* — Ly D Pham
(74) *Attorney, Agent, or Firm* — International IP Law Group, P.L.L.C.

(57) ABSTRACT

The claimed subject matter includes techniques for printing three-dimensional (3D) objects. An example method includes obtaining a 3D model and processing the 3D model to generate layers of tool path information. The processing includes automatically optimizing the orientation of the 3D model to reduce an amount of support material used in the printing. The method also includes printing the 3D object using layers.

20 Claims, 13 Drawing Sheets

(51) Int. Cl.
  *G06T 19/20* (2011.01)
  *G06T 7/00* (2017.01)
  *G06F 17/50* (2006.01)
  *B33Y 50/00* (2015.01)
  *B33Y 10/00* (2015.01)
  *B33Y 30/00* (2015.01)
  *B33Y 50/02* (2015.01)
  *B29C 64/106* (2017.01)
  *B29C 64/40* (2017.01)

(52) U.S. Cl.
  CPC .............. *B29C 64/40* (2017.08); *B33Y 10/00* (2014.12); *B33Y 30/00* (2014.12); *B33Y 50/00* (2014.12); *B33Y 50/02* (2014.12); *G06F 17/50* (2013.01); *G05B 2219/35134* (2013.01); *G05B 2219/49007* (2013.01)

(58) Field of Classification Search
  USPC .......................................................... 700/98
  See application file for complete search history.

(56) References Cited

U.S. PATENT DOCUMENTS

| | | | | |
|---|---|---|---|---|
| 2004/0249809 | A1* | 12/2004 | Ramani | G06F 17/30259 |
| 2005/0154481 | A1 | 7/2005 | Berger et al. | |
| 2006/0054039 | A1* | 3/2006 | Kritchman | B29C 64/245 |
| | | | | 101/424.1 |
| 2007/0029693 | A1 | 2/2007 | Wigand et al. | |
| 2007/0233298 | A1 | 10/2007 | Heide et al. | |
| 2013/0213812 | A1* | 8/2013 | Ludwig | B01L 7/525 |
| | | | | 204/601 |
| 2014/0043436 | A1* | 2/2014 | Bell | G06T 19/20 |
| | | | | 348/46 |
| 2014/0048970 | A1* | 2/2014 | Batchelder | B29C 64/106 |
| | | | | 264/129 |
| 2014/0175706 | A1 | 6/2014 | Kritchman | |
| 2014/0228997 | A1* | 8/2014 | Phillips | G06F 17/50 |
| | | | | 700/182 |
| 2015/0165691 | A1* | 6/2015 | Mark | G05B 15/02 |
| | | | | 700/98 |
| 2015/0269282 | A1* | 9/2015 | Nelaturi | G06F 17/50 |
| | | | | 700/98 |
| 2015/0269289 | A1* | 9/2015 | Kim | G06F 17/5009 |
| | | | | 703/6 |
| 2016/0002790 | A1* | 1/2016 | Whitaker | B82Y 40/00 |
| | | | | 428/626 |
| 2016/0020192 | A1* | 1/2016 | Dropps | H01L 23/5328 |
| | | | | 257/746 |
| 2016/0047075 | A1* | 2/2016 | Foley | D04H 1/728 |
| | | | | 264/465 |
| 2016/0305598 | A1* | 10/2016 | Ranade | B32B 15/08 |
| 2016/0311165 | A1* | 10/2016 | Mark | B33Y 10/00 |

FOREIGN PATENT DOCUMENTS

| | | |
|---|---|---|
| CN | 103777911 A | 5/2014 |
| WO | 2012076205 A1 | 6/2012 |

OTHER PUBLICATIONS

"Supplementary Partial Search Report Issued in European Patent Application No. 14900910.2", dated Apr. 6, 2018, 22 Pages.
"Search Report Issued in European Search Report Application No. 14900910.2", dated Jul. 11, 2018, 18 pages.
"Office Action Issued in Chinese Patent Application No. 201480063263.5", dated May 22, 2018, 11 Pages.
Marsan, et al., "An Integrated Software System for Process Planning for Layered Manufacturing", In Proceedings of Solid Freeform Fabrication Symposium, Jan. 1, 1997, pp. 661-668.
Kulkarni, et al., "A review of process planning techniques in layered manufacturing", In Journal of Rapid Prototyping, vol. 6, Issue 1, Mar. 1, 2000, pp. 18-25.
"Second Office Action Issued in Chinese Patent Application No. 201480063263.5", dated Jan. 31, 2019, 6 Pages.

* cited by examiner

FABRICATING THREE DIMENSIONAL OBJECTS

CROSS REFERENCE TO RELATED APPLICATIONS

Pursuant to 35 U.S.C. § 371, this application is the United States National Stage Application of International Patent Application No. PCT/CN2014/085497, filed Aug. 29, 2014.

BACKGROUND

Three-dimensional (3D) objects may be fabricated in various ways, including printing and additive manufacturing processes, such as fused deposition modeling. A 3D printer, for example, can create various 3D objects based on a digital representation of the object, referred to herein as a 3D model. The 3D model can be generated using a computer aided design (CAD) system or a 3D scanner, for example. The quality of output from consumer 3D printers is highly dependent on the quality of the software that prepare 3D content for the printer. 3D printers typically employ a process known as fused filament deposition to extrude thermal plastic through a hot nozzle. The software that drives these printers is often called a "slicer" because it decomposes a 3D model into 2D layers of tool path information specific to the printing device. There are a relatively small number of 3D slicers available to consumers. The slicers that are available generally do not provide sufficient print quality.

SUMMARY

The following presents a simplified summary of the innovation in order to provide a basic understanding of some aspects described herein. This summary is not an extensive overview of the claimed subject matter. It is intended to neither identify key elements of the claimed subject matter nor delineate the scope of the claimed subject matter. Its sole purpose is to present some concepts of the claimed subject matter in a simplified form as a prelude to the more detailed description that is presented later.

An implementation provides a system for fabricating a three-dimensional (3D) object. The system includes a processor and a system memory comprising code to direct the processor. When executed this code can cause the processor to obtain a 3D model of the 3D object. This code may also cause the processor to compute, for a number of orientations of a 3D model, a volume of a support region used to support overhanging portions of the 3D model during printing. This code can also cause the processor to identify one of the number of orientations of the 3D model as a selected orientation based on the volume of the support region. Further, the code may cause the processor to orient the 3D model according to the selected orientation and print the 3D object.

Another implementation provides method for fabricating a three-dimensional (3D) object. The method can include obtaining a 3D model of the 3D object. The method may also include computing, for a number of orientations of the 3D model, a volume of a support region used to support overhanging portions of the 3D model during printing. Further the method may include identifying one of the plurality of orientations of the 3D model as a selected orientation based on the volume of the support region. The method can also include orienting the 3D model according to the selected orientation and printing the 3D object.

Another implementation provides one or more computer-readable storage medium for storing computer readable instructions that, when executed by one or more processing devices, instruct the fabrication of a 3D object. The computer-readable medium include instructions to obtain a 3D model of the 3D object. The computer-readable medium also include instructions to compute, for a number of orientations of a 3D model, a volume of a support region to support overhanging portions of the 3D model during printing. The computer-readable medium include instructions to identify one of the number of orientations of the 3D model as a selected orientation based on the volume of the support region. Further, the computer-readable medium include instructions to orient the 3D model according to the selected orientation and print the 3D object.

The following description and the annexed drawings set forth in detail certain illustrative aspects of the claimed subject matter. These aspects are indicative, however, of a few of the various ways in which the principles of the innovation may be employed and the claimed subject matter is intended to include all such aspects and their equivalents. Other advantages and novel features of the claimed subject matter will become apparent from the following detailed description of the innovation when considered in conjunction with the drawings.

DETAILED DESCRIPTION

Slicing software can be improved with new algorithms specifically designed to correct problems that reduce the quality of output independent of the specific printing device physical characteristics. This disclosure describes techniques to improve 3D print quality, including the support generation, the infill, and the optimization of starting points. In some examples, the techniques described herein improve print quality of the Fused-Filament Manufacturing (FFM) technique. The present techniques provide the ability to improve the orientation of the 3D models in order to reduce support material, the ability to detach the support material easily from the 3D models, and the ability to generate internal support when printing without infill. The present techniques also provide the ability to improve the infill pattern for solid objects, generate "zig-zag" sparse infill pattern that connects with the solid infill, and open the internal shell for solid infill. The present techniques also provide the ability to improve printing starting point position to improve surface quality. These techniques are described in more detail below.

Figure 1:
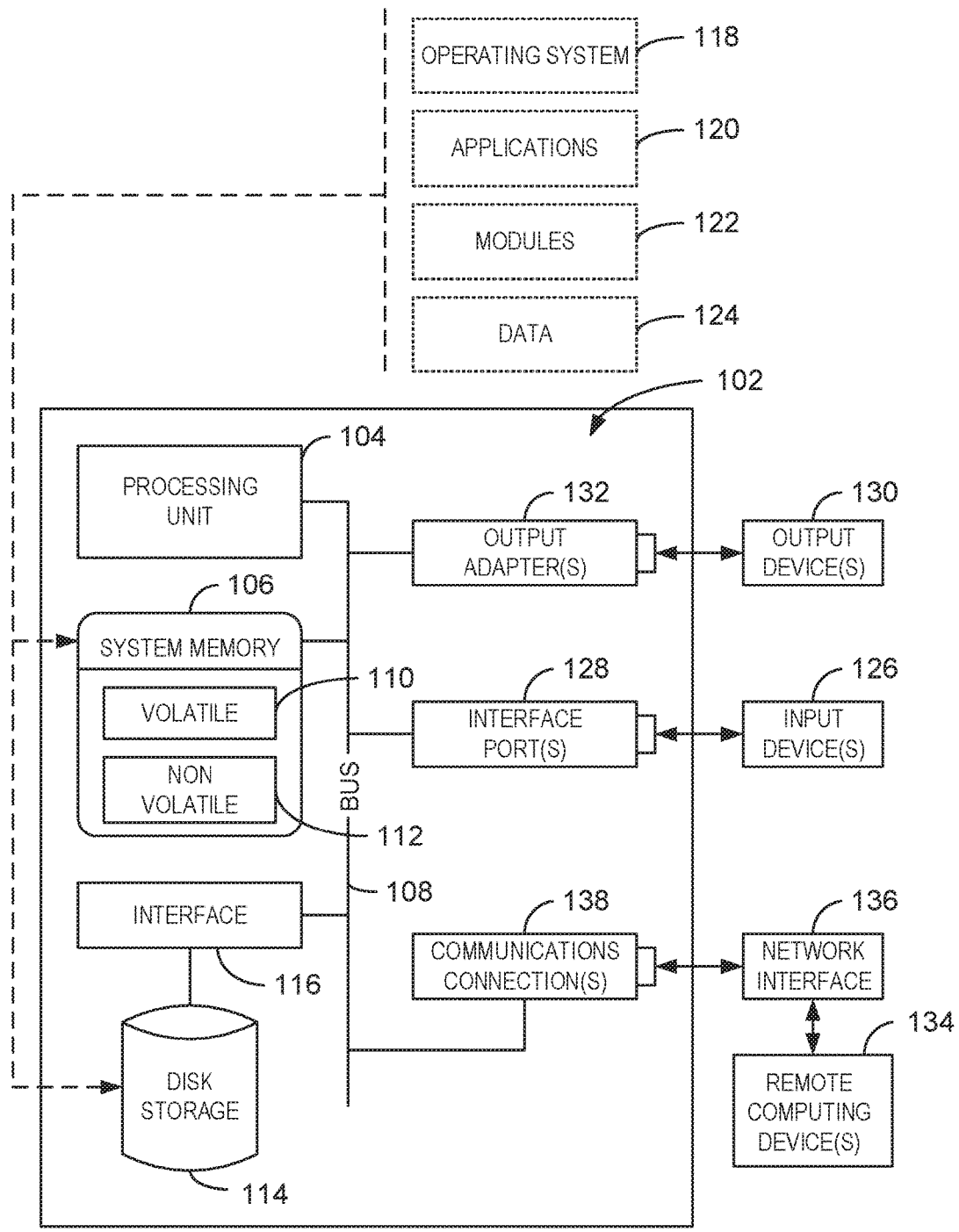
FIG. 1 is a block diagram of an example operating environment configured for implementing various aspects of the techniques described herein.

As a preliminary matter, some of the figures describe concepts in the context of one or more structural components, variously referred to as functionality, modules, features, elements, or the like. The various components shown in the figures can be implemented in any manner, such as software, hardware, firmware, or combinations thereof. In some cases, various components shown in the figures may reflect the use of corresponding components in an actual implementation. In other cases, any single component illustrated in the figures may be implemented by a number of actual components. The depiction of any two or more separate components in the figures may reflect different functions performed by a single actual component. FIG. 1, discussed below, provides details regarding one system that may be used to implement the functions shown in the figures.

Other figures describe the concepts in flowchart form. In this form, certain operations are described as constituting distinct blocks performed in a certain order. Such implementations are exemplary and non-limiting. Certain blocks described herein can be grouped together and performed in a single operation, certain blocks can be broken apart into multiple component blocks, and certain blocks can be performed in an order that differs from that which is illustrated herein, including a parallel manner of performing the blocks. The blocks shown in the flowcharts can be implemented by software, hardware, firmware, manual processing, or the like. As used herein, hardware may include computer systems, discrete logic components, such as application specific integrated circuits (ASICs), or the like.

As to terminology, the phrase "configured to" encompasses any way that any kind of functionality can be constructed to perform an identified operation. The functionality can be configured to perform an operation using, for instance, software, hardware, firmware, or the like. The term, "logic" encompasses any functionality for performing a task. For instance, each operation illustrated in the flowcharts corresponds to logic for performing that operation. An operation can be performed using, software, hardware, firmware, or the like. The terms, "component," "system," and the like may refer to computer-related entities, hardware, and software in execution, firmware, or combination thereof. A component may be a process running on a processor, an object, an executable, a program, a function, a subroutine, a computer, or a combination of software and hardware. The term, "processor," may refer to a hardware component, such as a processing unit of a computer system.

Furthermore, the claimed subject matter may be implemented as a method, apparatus, or article of manufacture using standard programming and engineering techniques to produce software, firmware, hardware, or any combination thereof to control a computing device to implement the disclosed subject matter. The term, "article of manufacture," as used herein is intended to encompass a computer program accessible from any computer-readable storage device or media. Computer-readable storage media can include, but are not limited to, magnetic storage devices, e.g., hard disk, floppy disk, magnetic strips, optical disk, compact disk (CD), digital versatile disk (DVD), smart cards, flash memory devices, among others. In contrast, computer-readable media, i.e., not storage media, may include communication media such as transmission media for wireless signals and the like.

FIG. 1 is intended to provide a brief, general description of a computing environment in which the various techniques described herein may be implemented. For example, a method and system for generating a 3D model to be used for fabricating 3D objects can be implemented in such a computing environment. While the claimed subject matter has been described above in the general context of computer-executable instructions of a computer program that runs on a local computer or remote computer, the claimed subject matter also may be implemented in combination with other program modules. Generally, program modules include routines, programs, components, data structures, or the like that perform particular tasks or implement particular abstract data types.

FIG. 1 is a block diagram of an example operating environment configured for implementing various aspects of the techniques described herein. The example operating environment 100 includes a computer 102. The computer 102 includes a processing unit 104, a system memory 106, and a system bus 108.

The system bus 108 couples system components including, but not limited to, the system memory 106 to the processing unit 104. The processing unit 104 can be any of various available processors. Dual microprocessors and other multiprocessor architectures also can be employed as the processing unit 104.

The system bus 108 can be any of several types of bus structure, including the memory bus or memory controller, a peripheral bus or external bus, and a local bus using any variety of available bus architectures known to those of ordinary skill in the art. The system memory 106 includes computer-readable storage media that includes volatile memory 110 and nonvolatile memory 112.

The basic input/output system (BIOS), containing the basic routines to transfer information between elements within the computer 102, such as during start-up, is stored in nonvolatile memory 112. By way of illustration, and not limitation, nonvolatile memory 112 can include read-only memory (ROM), programmable ROM (PROM), electrically programmable ROM (EPROM), electrically erasable programmable ROM (EEPROM), or flash memory.

Volatile memory 110 includes random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), SynchLink™ DRAM (SLDRAM), Rambus® direct RAM (RDRAM), direct Rambus® dynamic RAM (DRDRAM), and Rambus® dynamic RAM (RDRAM).

The computer 102 also includes other computer-readable media, such as removable/non-removable, volatile/non-volatile computer storage media. FIG. 1 shows, for example a disk storage 114. Disk storage 114 includes, but is not limited to, devices like a magnetic disk drive, floppy disk drive, tape drive, Jaz drive, Zip drive, LS-210 drive, flash memory card, or memory stick.

In addition, disk storage 114 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 114 to the system bus 108, a removable or non-removable interface is typically used such as interface 116.

It is to be appreciated that FIG. 1 describes software that acts as an intermediary between users and the basic computer resources described in the suitable operating environment 100. Such software includes an operating system 118. Operating system 118, which can be stored on disk storage 114, acts to control and allocate resources of the computer 102.

System applications 120 take advantage of the management of resources by operating system 118 through program modules 122 and program data 124 stored either in system memory 106 or on disk storage 114. It is to be appreciated that the claimed subject matter can be implemented with various operating systems or combinations of operating systems.

A user enters commands or information into the computer 102 through input devices 126. Input devices 126 include, but are not limited to, a pointing device, such as, a mouse, trackball, stylus, and the like, a keyboard, a microphone, a joystick, a satellite dish, a scanner, a TV tuner card, a digital camera, a digital video camera, a web camera, and the like. The input devices 126 connect to the processing unit 104 through the system bus 108 via interface ports 128. Interface ports 128 include, for example, a serial port, a parallel port, a game port, and a universal serial bus (USB).

Output devices 130 use some of the same type of ports as input devices 126. Thus, for example, a USB port may be used to provide input to the computer 102, and to output information from computer 102 to an output device 130.

Output adapter 132 is provided to illustrate that there are some output devices 130 like monitors, speakers, and printers, among other output devices 130, which are accessible via adapters. The output adapters 132 include, by way of illustration and not limitation, video and sound cards that provide a means of connection between the output device 130 and the system bus 108. It can be noted that other devices and systems of devices can provide both input and output capabilities such as remote computers 134.

The computer 102 can be a server hosting various software applications in a networked environment using logical connections to one or more remote computers, such as remote computers 134. The remote computers 134 may be client systems configured with web browsers, PC applications, mobile phone applications, and the like. The remote computers 134 can be a personal computer, a server, a router, a network PC, a workstation, a microprocessor based appliance, a mobile phone, a peer device or other common network node and the like, and typically includes many or all of the elements described relative to the computer 102.

Remote computers 134 can be logically connected to the computer 102 through a network interface 136 and then connected via a communication connection 138, which may be wireless. Network interface 136 encompasses wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection 138 refers to the hardware/software employed to connect the network interface 136 to the bus 108. While communication connection 138 is shown for illustrative clarity inside computer 102, it can also be external to the computer 102. The hardware/software for connection to the network interface 136 may include, for exemplary purposes, internal and external technologies such as, mobile phone switches, modems including regular telephone grade modems, cable modems and DSL modems, ISDN adapters, and Ethernet cards.

An example processing unit 104 for the server may be a computing cluster. The disk storage 114 may comprise an enterprise data storage system, for example, holding thousands of impressions. The computer 102 can be configured to instruct a printer to fabricate a 3D object. The data 124 may include one or more initial 3D models, which may be obtained from a portable storage device or downloaded from a remote computer or via the internet, for example. In some examples, the 3D model is a mesh model.

One or more of applications 120 may be configured to enable a user to generate and customize a 3D model for later fabrication as an object. The user need not generate the 3D model as the application 120 may automate this process or adapt a 3D model ultimately obtained from an input device 126 or remote computing device 134 via a network interface 136.

The user can instruct the computer 102 to generate the 3D model using software such as 3D computer aided design (CAD) software such as 3D builder. The user may then store the 3D model, for example to disk storage 114, or send the 3D model to a fabricator, such as the fabricator 200 describe below in relation to FIG. 2. The computations executed by the computer 102 to generate the 3D model are described further below in relation to FIG. 3.

In some examples, some or all of the processes performed for generating the mesh can be performed in a cloud service and reloaded on the client computer of the user. For example, some or all of the applications described for the 3D model could be running in a cloud service and receiving input from a user through a client computer. Thus, the computations involved in computing the 3D model could be performed on a cloud computing system. These computations could include adjusting 3D model orientation, varying printer height and print delay times, reducing unneeded internal support, generating half-edges for nearly parallel infill patterns, aligning sparse infill into a grid configuration, improving the attachment of infill to an outer shell, or choosing a starting point and ending point for a print job. In other examples, a user could request the printing of a 3D object from a computer by making a request to a cloud service. The cloud service could then retrieve the 3D model from a remote computer, modify and generate printing instructions based on the techniques herein described, and return printing instructions to a printer. The printer may be local to the user or remote and later retrieved by the user. In other examples, the user may generate the 3D model locally and submit the generated model to a cloud service which computes printing instructions based on techniques herein described, and return printing instructions to a printer.

Figure 2:
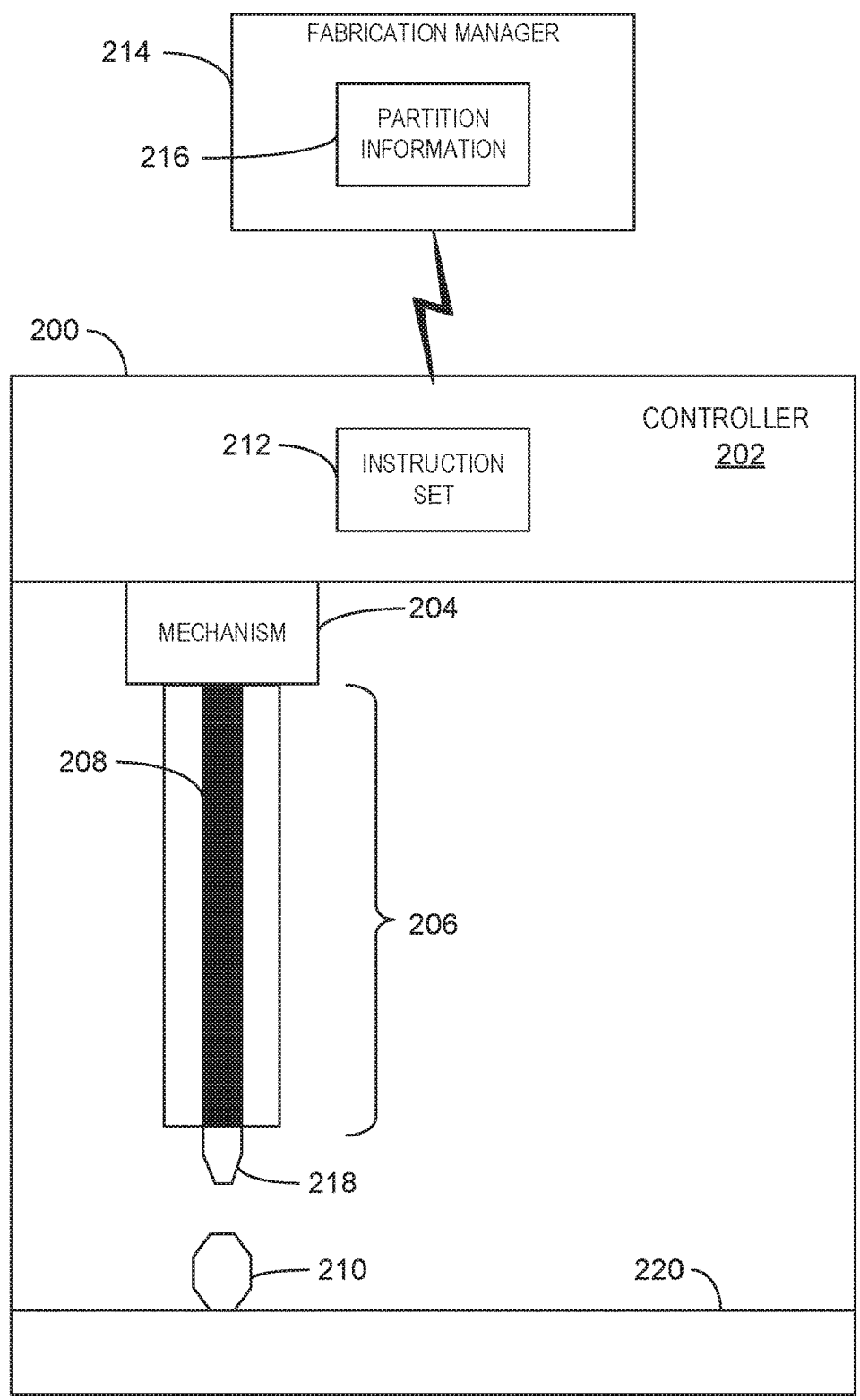
FIG. 2 is a block diagram of an example fabricator for fabricating a 3D object from a 3D model.

FIG. 2 is a block diagram of an example fabricator for fabricating a 3D object using on a 3D model. The fabricator 200 may include a control unit or controller 202 coupled to a first mechanism 204 and configured to execute instructions for the first mechanism 204 and a second mechanism 206. A chamber 208 constructed within the second mechanism 206 allows materials to be prepared, e.g., heated and blended, when fabricating an object 210. For example, the chamber 208 is used for melting and extruding filaments or other compatible materials.

The first mechanism 204 may be referred to as a robotic mechanism, e.g., a gantry robot, including various mechanical or electro-mechanical components. By executing at least some instructions within an instruction set 212, the first mechanism 204 may actuate these components into performing at least some physical movement. The fabrication manager 214 may generate the instruction set 212 by partitioning a 3D model, including a 3D model, into layers and providing specific fabrication instructions for each layer. When actuated, these components may move horizontally, vertically, diagonally, rotationally, and so forth. One example implementation of the first mechanism 204 moves a printing mechanism or tool across an x, y, or z-axis in order to deposit material at a specific position within the object 210 being fabricated.

The second mechanism 206 may be referred to as a printing mechanism that includes one or more printing tool heads. The material may be pushed or pulled into a printing tool head, and the motors may be mounted further away in order to push the material through a thin guide tube into the chamber 208. Although the second mechanism 206 may resemble an extruder configuration, e.g., a single extruder head configuration, it is appreciated that the second mechanism 206 represents any compatible technology, including legacy printing tool heads configured to deposit various types of materials.

The instructions mentioned above, which are stored in an instruction set 212, may be collectively referred to as coordinated instructions because such instructions are executed, in coordination with multiple components. For example, instructions for different stepper motors in an extruder configuration may be coordinated such that an appropriate extrudable material is fed into the chamber 208. Accordingly, an instruction for one stepper motor may be synchronized in time with an instruction for another stepper motor such that both stepper motors can operate in coordination with each other.

The fabrication manager 214 may include hardware and software components operating on various implementations of computing devices, such as a remote computing device and an attached computing device. One example implementation of the fabrication manager 214 processes a 3D model corresponding to an object being fabricated and partitions that information into layers in which each layer includes at least some geometry, which may include geometric elements corresponding to a surface mesh. The present disclosure may use "partition", "slice", or another similar term in place of "layer," and it is appreciated that these terms be defined as interchangeable.

Within partition information 216, the fabrication manager 214 stores a data structure corresponding to the 3D model. Geometry generally refers to a set of geometric elements, such as a 3D polyhedron or other shape, which may represent an amount of extrudable material to be deposited. One example measure represents at least a portion of the geometry—and therefore, the amount of extrudable material—volumetrically. The example measure may define a portion of the geometry using standardized units in which each unit represents a minimal amount, e.g., volume, of colored material at a given time instance, such as by an extrusion width. Each geographic element may include one or more standardized units.

The fabrication manager 214 is configured to generate instructions that, when executed by the controller 202, actuate components of the first mechanism 204, which may result in movements of the second mechanism 206 following a surface geometry, e.g., an exterior shell of the object 210. Optionally, a movable platform, such as a platform 220, functions as a mechanism for printing the object 210. The first mechanism 204 may operate the platform 220 to guide the object 210 and the nozzle 218 to each other. The instruction set 212 may include instructions for automatically calibrating the platform 220 such that through a series of movements in an x, y, and z direction or in rotation across an x-y plane, the 3D object 210 is moved to a correct position for the nozzle 218 to deposit material.

Some example implementations of the fabricator 200 include legacy devices that are retrofitted with at least some of the components described herein, including the controller 202, the fabrication manager 214, and a printing tool head, such as the second mechanism 206. As one option, the fabricator 200 may include an additional microprocessor to manage the set of motors and to receive a signal from an original microprocessor when a command is processed.

To illustrate one example, a verified manifold object, represented in a 3D mesh model, may be partitioned into layers by processing each polygon representing the object, and projecting each polygon through a slicing plane. This projection generates a point and connections to other points in a manner that eventually creates a path. From this point, the path is reduced to units, e.g., volumetric measures of geometric elements, representing addressable units for a specific hardware characteristic of a corresponding fabricator. The units may not be the same size, axis aligned, and the same size in each dimension. One example implementation may utilize non-cubic units of different sizes along an x, y, or z axis, which enables different effective resolutions per dimension. According to an example implementation, the partition information 216 may include voxelized data such that each addressable (voxel) unit includes a variety of information, such as color, texture, and lighting values, for geometry within that addressable voxel unit.

An example fabricator 200 includes an arrangement of motors and a tool head having a mixing chamber and a nozzle. The tool head also may include a heating element for melting extrudable material to a prescribed temperature. When fabricating the 3D object, the fabrication manager 214 determines an approximate amount of extrudable material capable of being deposited at a given (x, y, z) location. The fabrication manager 214 uses the determined amount to define addressable units on the object's shell. Each unit represents a specific geometric element or a portion of the 3D object. The addressable units may be represented herein as voxelized data, e.g., voxelized data structure. In an example implementation, the fabrication manager 214 determines volume in voxel units, e.g., volumetric pixels. The fabricator's 3D space is factored by a minimum volume of extrudable material. Other information may include implicit values, such as, distance to an object surface mesh, probabilities indicating whether a voxel unit of the object occupies the volume represented. This technique may be applied to the object's entire volume, including the outer shell.

Figure 3:
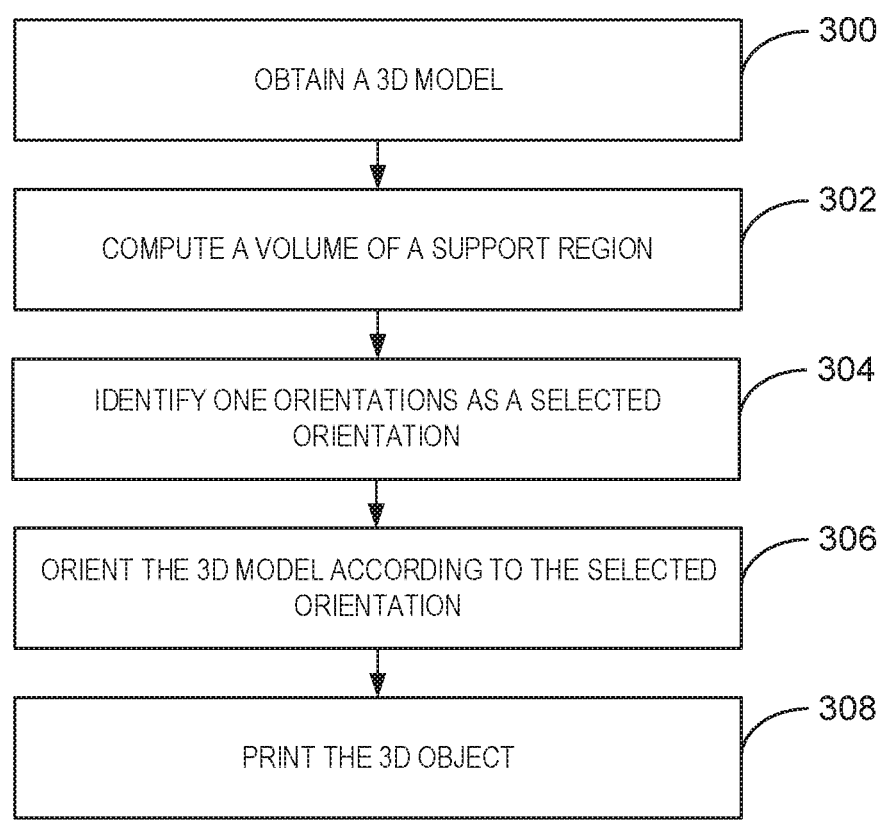
FIG. 3 shows a process flow diagram of a method for fabricating a 3D object.

FIG. 3 shows a process flow diagram of a method for fabricating a 3D object. In block 300, a 3D model is obtained for a 3D object. At block 302, a volume of a support region is computed. In one an example, this computation of a support region volume is made for a plurality of orientations of the 3D model. At block 304, a 3D model orientation is identified as a selected orientation. This identification of a selected orientation may be the orientation of the 3D model with the smallest computed support region volume. At block 306, the 3D model is oriented according to the selected orientation. At block 308, a 3D object is printed.

Figure 4A:
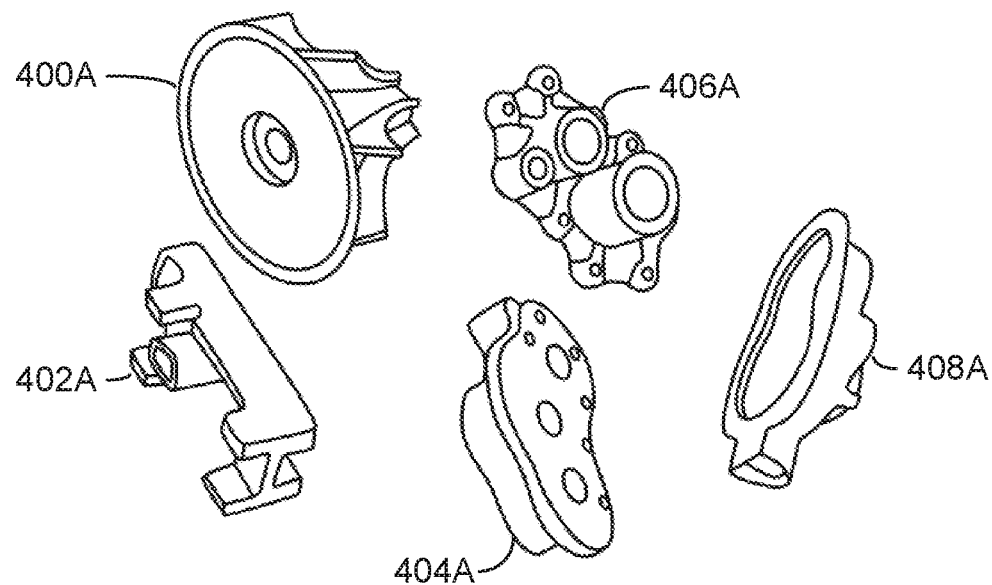
FIGS. 4a-b are an illustration of a technique for improving the orientation of the 3D models to reduce the volume of a support material region.
Figure 4B:
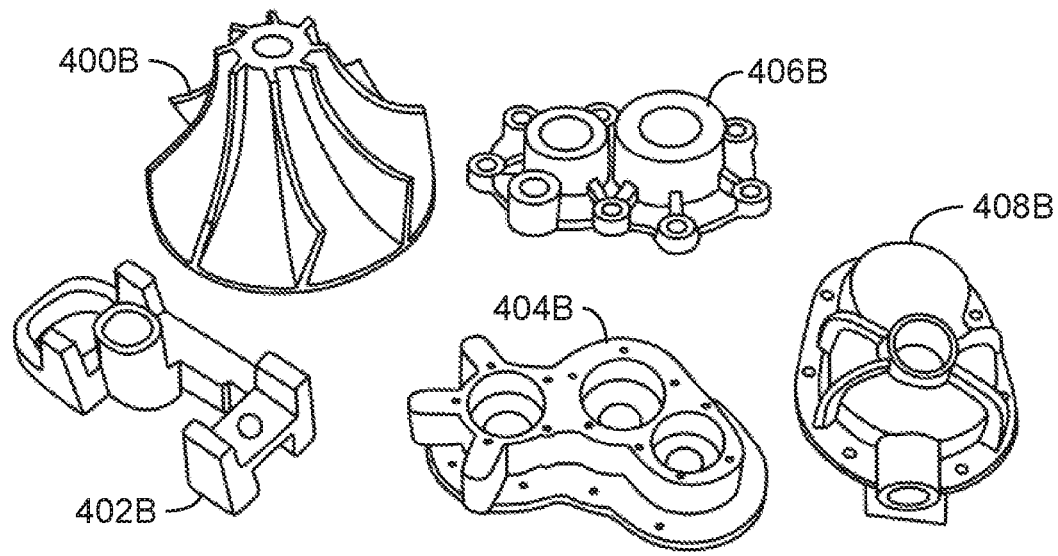

FIGS. 4a-b are an illustration of a technique for improving the orientation of the 3D models to reduce the volume of a support material region. FIG. 4a shows several 3D models 400a-408a randomly oriented, similar to how a user may position the 3D models in the print bed of the printer software. The example 3D models 400a-408a shown are positioned at extreme degrees, however in practice, a user or software may attempt to lay each 3D model 400a-408a on a flat surface. A 3D model 400a-408a may not have a flat surface, or it may not be clear to the user which orientation is better to conserve printing material. For example, even if a 3D model is already oriented to lay flat on a surface, there may be better orientations for that 3D model in terms of minimizing the volume of support material used in fabrication.

Depending on the orientation of the 3D model, the printing of a support region can be used for printing objects with portions that over-hang, that is, protrude out from the 3D model in a way that a lower layer of the 3 d model would not be able to support if printed. As this over-hanging portion would otherwise be printed in air and collapse, a support region can be printed underneath this portion to provide support during the printing process and broken away later. In one example over-hang layer will require support for all overhang angles less than 45 degrees.

In one embodiment, each 3D model 400a-408a is analyzed one by one. A 3D convex hull may be computed in a number of ways. In one example, the 3D convex hull is computed from all vertices of the mesh of a 3D model to find an approximation of the 3D model shape. Next, each face of the computed convex hull, except the face that does not contain the orthogonal projection of the mass center of the model, is tested as the base of the 3D model and the volume of a support region that may be needed for that particular orientation is computed. This computation excludes computations for invalid orientations such as where an entire model is oriented so that the entire model is not self-supporting. After computing the volume of storage material for each orientation of the convex hull, the orientation with the lowest volume of computed support region volume may be selected as the bottom surface of the 3D model for printing. As an illustration of this process, the 3D models in FIG. 3a are each rotated by this process to an orientation seen in the objects of FIG. 3b. The orientation of the 3D models 400b-408b in FIG. 3b is such that the volume of support material is minimized. While in the above example a convex hull computation was used to approximate the shape of the 3D models 400a-408a, in other examples the object mesh itself may be used. However, in this example the convex hull was used as a computations involving a convex hull may greatly reduce computing time of this computation relative to computations involving an object mesh and thereby increase the performance of this process.

Figure 5A:
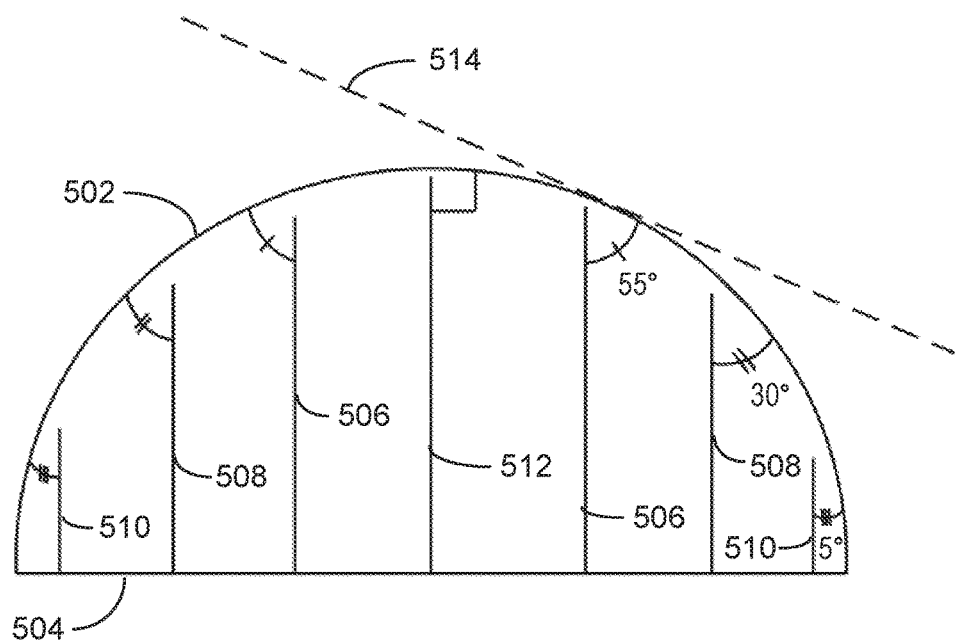
FIGS. 5a-b show cross-sectional diagrams illustrating a technique for reducing the amount of infill used to provide internal support when printing.
Figure 5B:
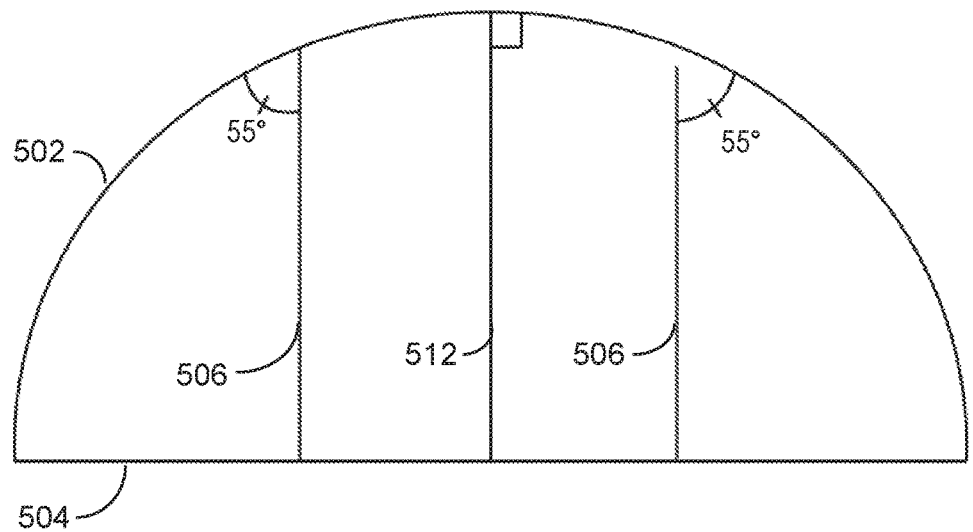

FIGS. 5a-b show cross-sectional diagrams illustrating a technique for reducing the amount of infill used to provide internal support when printing. Some 3D objects use interior support for increased strength. Accordingly, many 3D models have support internally. In an effort to reduce the amount of material used in printing, certain limitations can be placed on internal supports when certain over-hangs of 3D models are self-supporting. FIG. 5a is a cross sectional view of an object 500 with an upper level 502 and a base 504 that is supported by internal support regions 506-512 each corresponding to a segment of an upper level 502 with a different over-hang angle. The over-hang angle is one way of determining if an upper layer 502 of an object is self-supporting. In the present example, one overhang angle is computed as the acute angle formed by the intersection of an internal support 506 and the tangent of the upper level 502 where that internal support 506 is connected to it. For illustrative purposes, this angle is marked in FIG. 5a as 55°. Likewise, the over-hang angle of other upper level segments 502 above additional internal supports 508-510 are labeled as well. While FIG. 5a-b shows each angle labeled with a numerical value, this is only provided as an example.

A reduction of support region may be accomplished by eliminating the use of internal support printed for upper level portions 502 of a 3D object 500 that are self-supporting. The concept of self-supporting implies that even while being printed, this upper level 502 may not need the internal support 506-512. In the example of FIG. 5b, a rule is applied such that all internal support regions, for example 508 and 510, are not printed if they formerly supported upper layers of the 3D model with over-hang layers less than 45 degrees. As a result, support for a much smaller region is generated. This technique may reduce the material usage effectively and the total printing time is also reduced as less material is extruded.

Figure 6A:
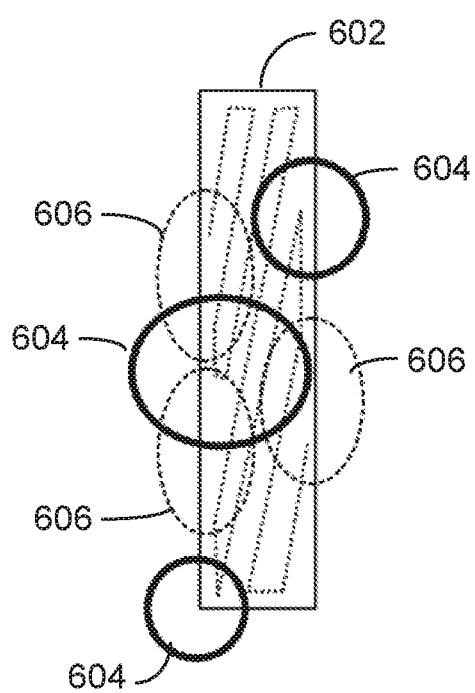
FIGS. 6a-b show a technique for improving the infill pattern for solid objects with nearly parallel printing paths.
Figure 6B:
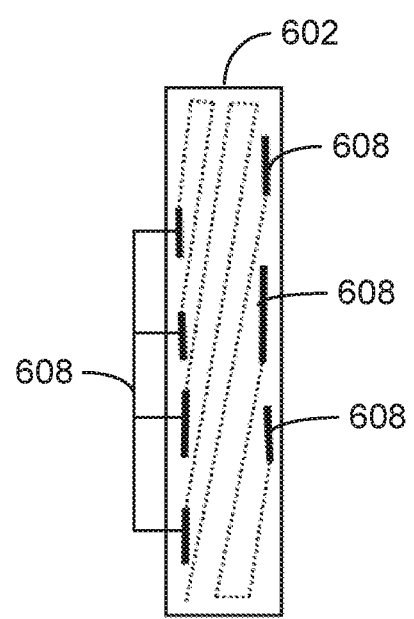

FIGS. 6a-b show a technique for improving the infill pattern for solid objects with nearly parallel printing paths. When printing solid regions, slicers may fill the region with one printer path that is close to parallel to the boundaries of that region. However, when the filling direction from the printing path and the boundary of the infill section boundary 602 is close to being in parallel, the printing path will have both over-fill regions 604 and under-fill regions 606. The over-fill regions are indicated by circles 604, and the under-fill regions are indicated by circles 606. In this example the over-fill may occur as a result of the printing path of the extruded material doubling back on itself as a result of a very small return angle in the printing path of infill. Likewise, on an opposite side of an infill section, the spacing of infill due to its orientation may create large underfill regions 606. To avoid these over-fill and under-fill regions, a half-edge infill pattern may be generated as shown in FIG. 5b. Half-edge means that the segments of the printing path are cut in half in the overfill regions 604, and that infill material is added into the underfill regions 606. These cuts and replacements are shown as the result of a modeled half-edge printing path 608 in FIG. 6b. This infill technique solves both the over-fill problems and the under-fill problems together. A half-edge infill pattern may also refer to a line of infill that makes no attempt to extrude in a continuous back and forth stream when its printing path is nearly parallel to an infill section boundary 602. Instead, as the printing path nears the infill section boundary, the material for a half-edge may also be extruded in a small parallel segment, here referred to as a half-edge end. A clearer demarcation of a half-edge end may be shown in FIG. 7.

Figure 7:
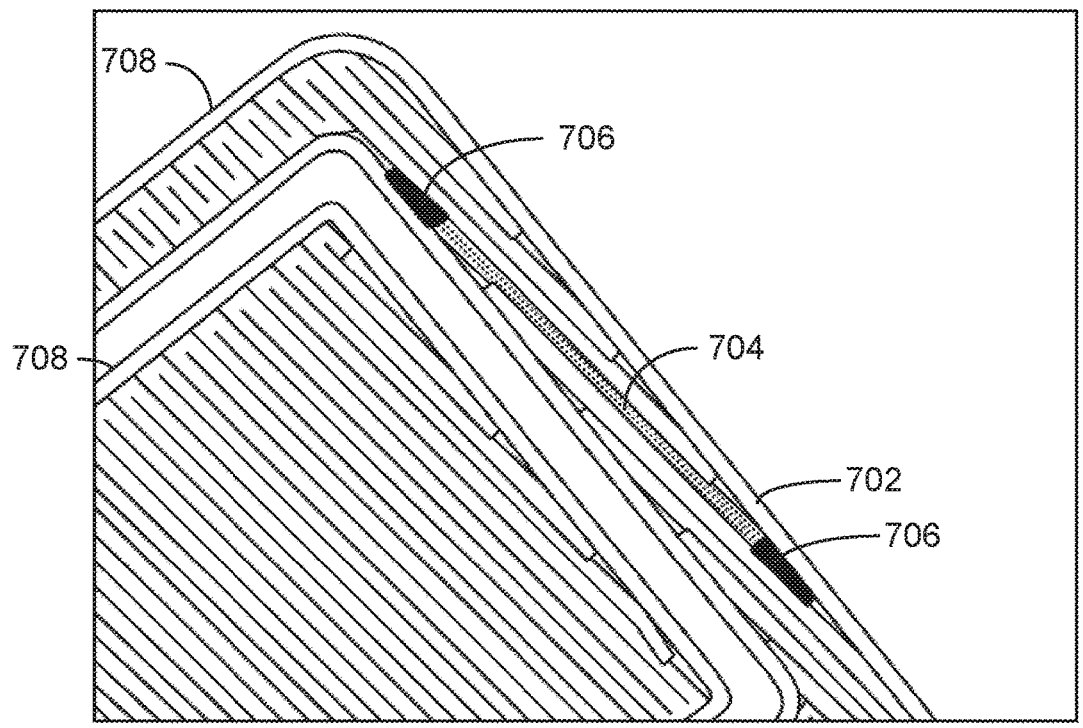
FIG. 7 is an illustration of a solid infill half-edge path on a select portion of a 3D model.

FIG. 7 is an illustration 700 of a solid infill boundary section 702 with a half-edge printing path 704 on a select portion of a 3D model. In addition to showing a half-edge printing path 704, FIG. 7 also demarcates the half-edge ends 706. Half-edge ends 706 may be portions of the half-edge printer path 704, but may also be separately printed as separate parallel portions to the infill boundary 702 to increase adhesion and overall structural support. As discussed above, the half-edge ends 706 may also be the portions of the infill which have been relocated from another section of the printer path to eliminate under-fill and over-fill regions. As one example of the differing printer path styles, the FIG. 7 illustration includes an unbroken printing path 708 which does not have the same under-fill and over-fill issues as a printing path oriented closer to parallel with the infill boundary section 702. Accordingly, while half-edges 704 may be used in some portions of a 3D model, they are most beneficial in infill boundary sections 702 with a nearly parallel printing pattern providing the infill.

Figure 8A:
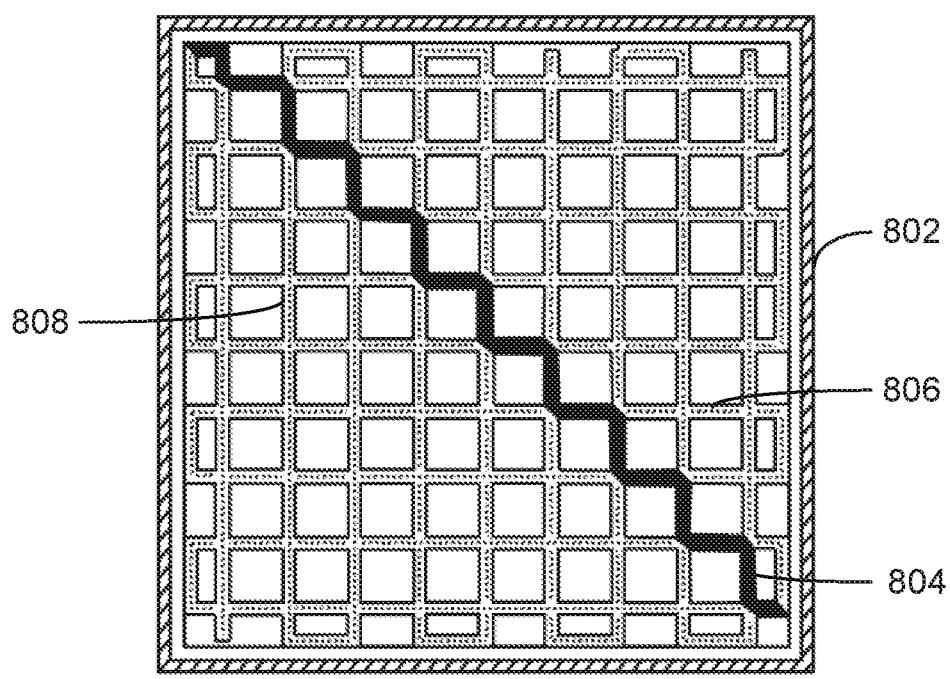
FIGS. 8a-b show a diagram where a "zig-zag" sparse infill pattern is generated and connecting with the solid infill.
Figure 8B:
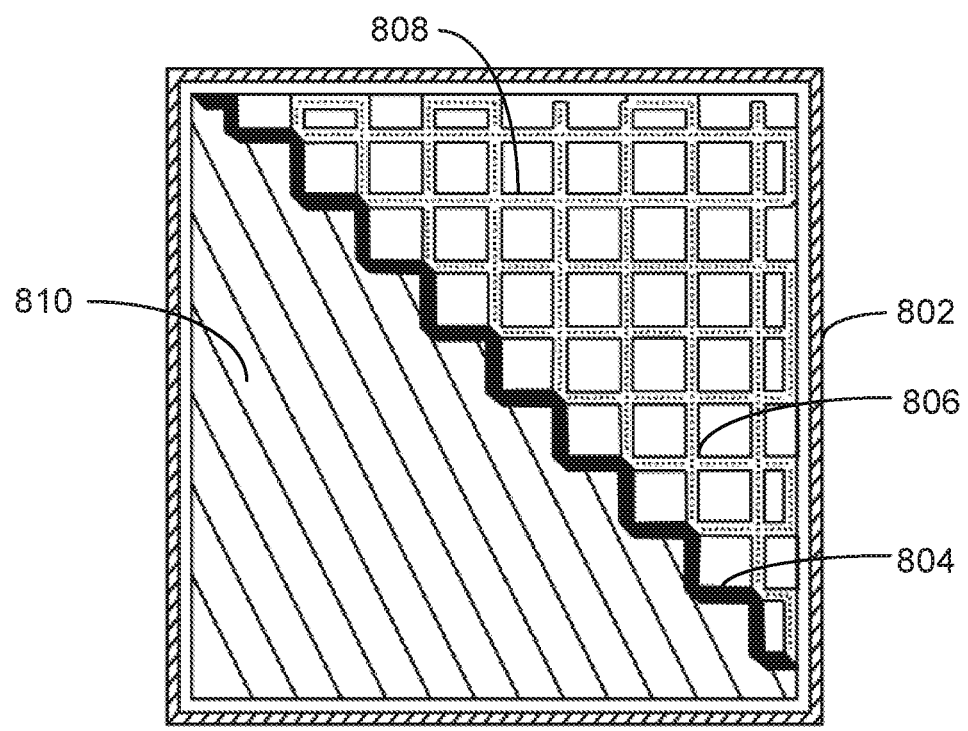

FIGS. 8a-b show a diagram where a "zig-zag" sparse infill pattern is generated and connecting with the solid infill. Solid infill may be used for printing of exterior surfaces and for more sturdy support. Sparse infill, on the other hand may be used to reduce material usage in regions capable of standing with less support. FIG. 8a shows a view from above looking down on a layer that includes an infill boundary or shell 802, a sparse infill zig-zag printing path 804 and a rectangular grid 806 formed by additional infill printing paths also following a zig-zag pattern. A zig-zag pattern may also be described as a printing path made of alternating right angle turns, although zig-zag could encompass alternating turns of varied angles as well.

FIG. 8b shows a similar view from above of a layer including a sparse infill section 808, but also shows a solid infill section 810. The zig-zag infill printing paths pair to a similarly rectangular-based solid infill section. Ensuring that the solid sections are connected to the boundary of the sparse infill increases the strength of the solid sections of the layer.

In 3D models that use other infill patterns, there could be a weak connection between the solid infill 810 and sparse infill 808. For example, some slicers may not extend the solid infill 810 but then the shell 802 would not get support and the print of the 3D object may not be strong. Other slicers may extend the solid infill 810 to some random position without knowing how the solid infill connects to the sparse infill 806. Some slicers may extend the solid infill 808 all the way to the boundary or shell 802 of the object potentially wasting material. As seen in both FIGS. 8a and 8b, the zig-zag formation of sparse infill allows a grid layer 806 to be printed on each layer. This uniform grid layer 806 on each layer allows a better paired connection between sparse infill sections 808 and solid infill sections 810 of a layer. Additionally, a grid layer 804 for a sparse infill section 808 would provide a support infrastructure throughout the infill region if the grid infill pattern 806 is printed on each layer.

Figure 9A:
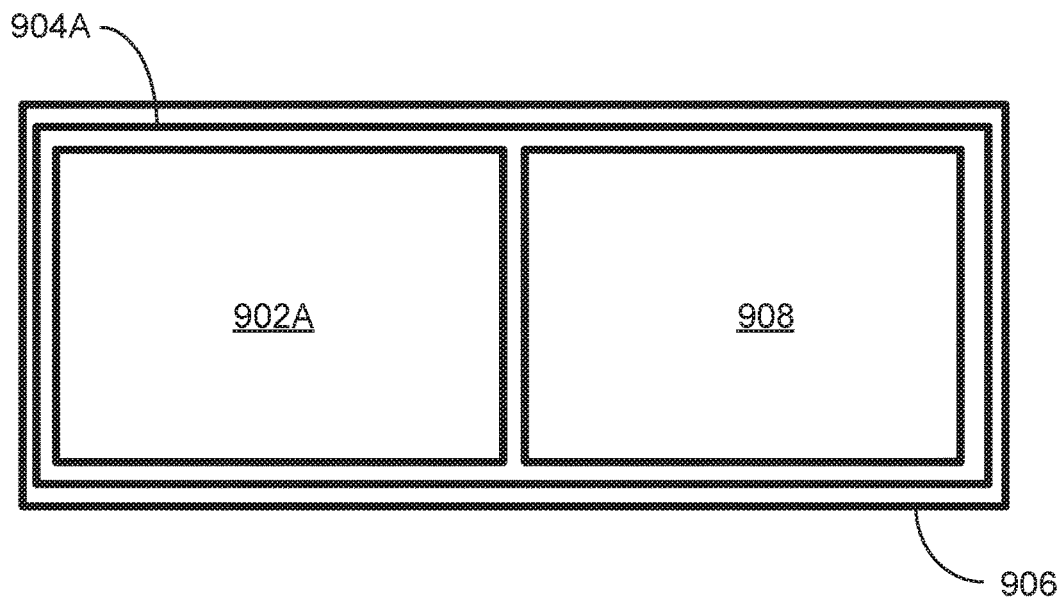
FIG. 9a-c show contrasting diagrams of layers viewed from above to illustrate a closed and opened internal shell of a 3D object.
Figure 9B:
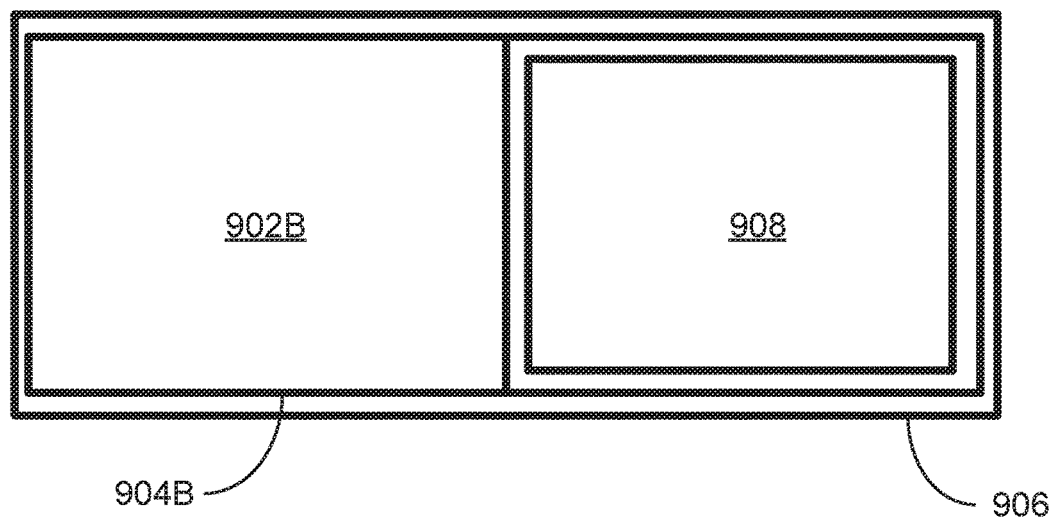
Figure 9C:
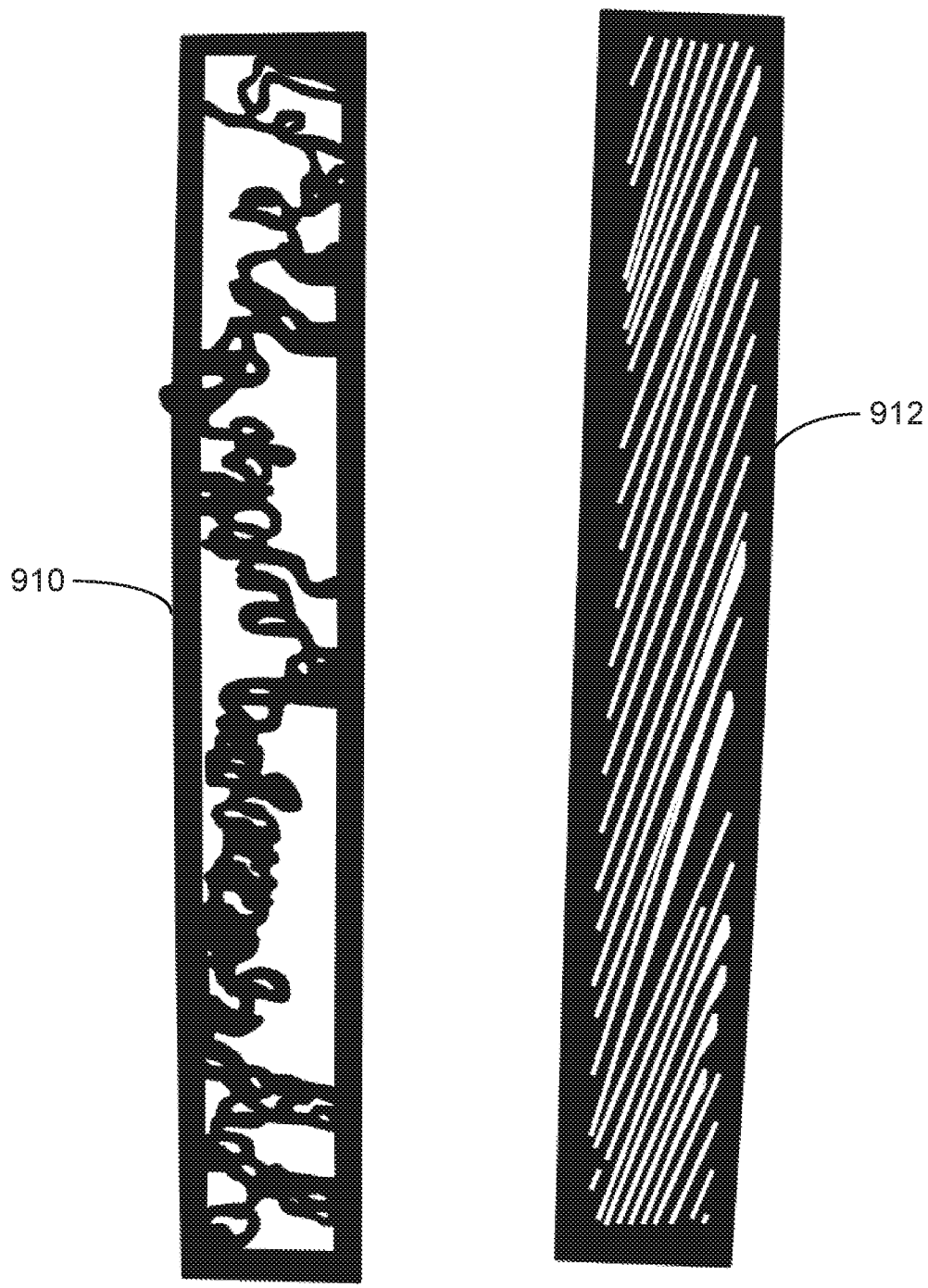

FIG. 9a-c show diagrams of layers viewed from above to illustrate a closed and opened internal shell of a 3D object. 3D object slicers may use a parameter named infill-overlap to define how close the solid infill is connected to the shells. A default value is 1.0, which means that the solid infill and the internal shell are just barely touched together, as shown by the solid infill 902a and internal shell 904a of FIG. 9a. The region 902a represents the solid infill. The region 908 represents the sparse infill. The solid infill region and sparse infill region are both contained within an external shell 906 and an internal shell 904a. The connection of the solid infill 902a to the adjacent internal shell 904a is often not strong enough to hold the solid infill 902a.

To make this connection stronger, the internal shell 904b can be opened or removed and the solid infill 902b enlarged, as shown in FIG. 9b. The solid infill 902b is enlarged to replace the portion of the shell left open by the internal shell 904b. As a portion of the internal shell 904b is opened or replaced in the section where the solid infill 902b is enlarged. Accordingly, the solid region 902b now can attach directly to the external shell 906 and also to any infill or shell in slicer layers previously printed. This technique allows the solid region 902b to rest on top of a previously printed layer in a lower position, rather than simply adhear by adjacency to an outer or inner shell. For FIG. 9b, a lower layer of solid infill 902b or internal shell 904b may serve as a foundation of the top layer solid infill section 902b. This method of attachment is not solely for solid infill, but for any infill which may be expanded and attached in a similar manner as described for FIG. 9b.

FIG. 9c shows one advantage of the technique implemented in FIG. 9b. The figure with the barely touched shell 910 is the commonly used approach most closely outlined by FIG. 9a. The barely touched shell 910 shows the result of infill connections that were not very strong and have curled and broken resulting in a failed print. The figure with successful connections 912 shows a 3D object with an internal shell portion replaced by a solid infill region, as diagramed most closely in FIG. 9b. The connections of the infill in the successfully printed 3D object 912 are much stronger and are secured to the external shell of the 3D object.

Figure 10:
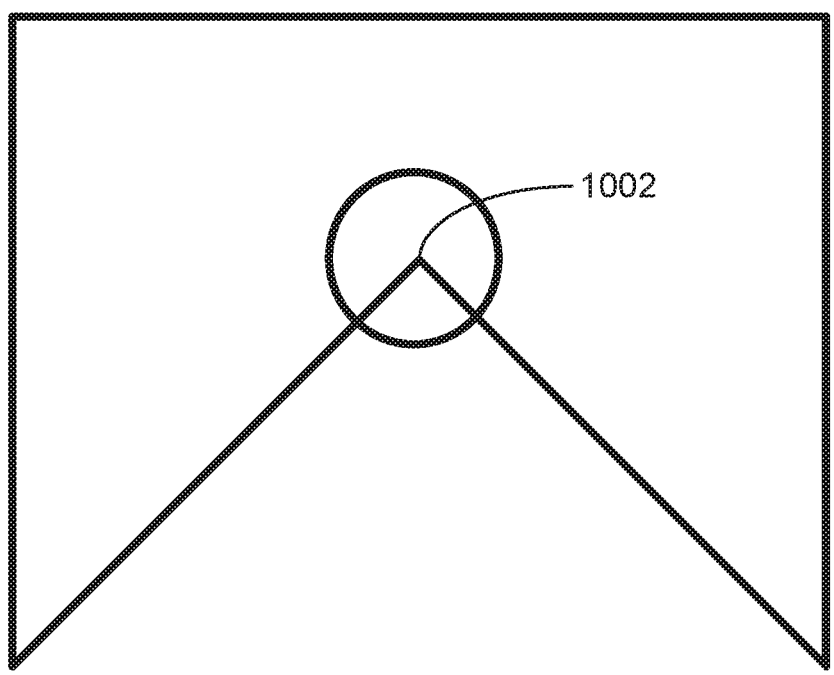
FIG. 10 is diagram that shows a technique for choosing a print starting point to improve surface quality.

FIG. 10 is diagram that shows a technique for choosing a print starting point to improve surface quality. The quality of the external shell is very sensitive to the starting point of the polygon as a starting point may leave a small blob of material on the exterior where printing beings and ends for a layer. In FIG. 10, a polygon 1000 has a concave corner 1002 that may serve as a starting point or ending point. The concave corner 1002 may tend to hide extra extruded material as concave corners are eliminate angles of vision and therefore make it harder to observe defects such as blobbing. As an extension, where a polygon may have several concave corners of a polygon, other embodiments are contemplated such that the concave corner with the most acute angle is selected as the starting point or each concave corner is randomly alternated between on differing layers in an attempt to spread out any inexact material extrusion points. Further, in the case of printing a smooth curve such as a cylinder or polygon with n-o concave corner, the starting point position can be randomized on every layer. Thus, the blobs are not aligned on the exterior of the cylinder in Z direction. The randomization produces less obvious starting blobs on the exterior so the surface looks smoother visually.

FIG. 11 is an illustration of a printing process with varying print layer height and print delay timing between different types of layers. As discussed above, 3D models may use a volume of a support region to assist in printing over-hanging portions of the 3D object. After printing is complete a user may manually remove these support regions. In many cases, removal may be a difficult and time intensive process. The present example demonstrates means for improving this separation process.

Figure 11A:
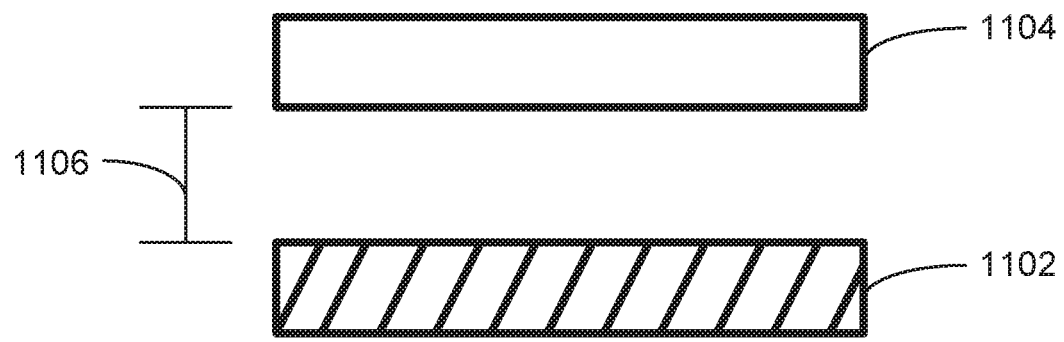
FIGS. 11a-c shows one possible phase progression that enable easy detachment of support material from a printed 3D object.
Figure 11B:
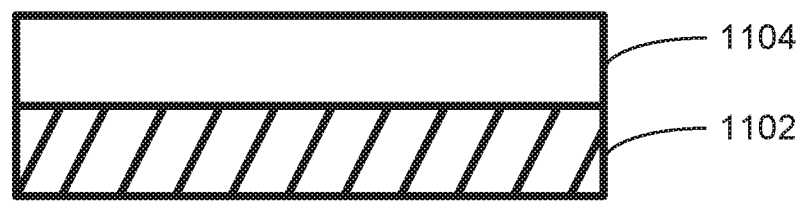
Figure 11C:
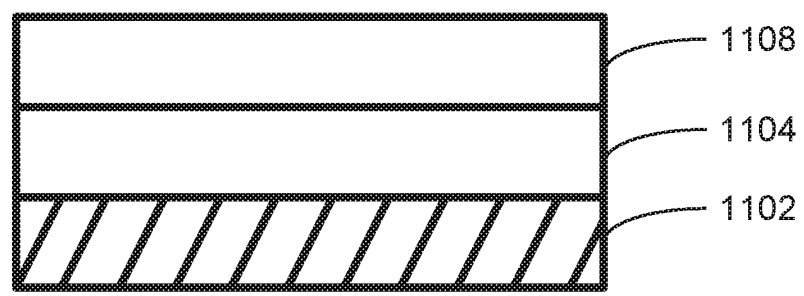

As discussed above, the nature of a printing process may involve extruding melted material such as melting filament. After extrusion, this melted filament may cool down in the computed position this filament was placed, layer by layer. When a top layer is hot, the top layer and the bottom layer may attach together strongly and become a connected and strong layer connection. However, when layers are extruded together at cooler temperatures or lower pressures, a less strong bond is formed. FIGS. 11a-c shows one possible phase progression that enable easy detachment of support material from a printed 3D object. In FIGS. 11a-c, several layers of a 3D object are including a layer of support region, which may support an overhanging region of an object, as well as several layers of a 3D object. FIGS. 11a-c show one method of printing these layers such that when the extruded material has cooled, the support region may be easier to detach from the 3D object. In FIG. 11a, the top layer of the support region 1104 is extruded first. Next, a bottom layer of the object 1104 may be extruded. However, rather than being extruded directly on top of the top layer of the support region 1104, the bottom layer of the 3D object is extruded from a larger print height 406. The increase in print height may vary as needed, however, in one example the print height is increased between 2 times of the layer height or 3 times of the layer height. This additional space creates not only extra time of cooling for the top layer of the support 1102 and the bottom layer of the object 1104, but also decreases the pressure with which the bottom layer of object 1104 is applied on the top layer of the support 1102. A print delay time may also be increased such that the time between printing the top layer of the support 1102 and the bottom layer of the object 1104 is larger. This larger print time delay between layers may allow the top layer of the support 1102 to cool down even more and therefore less effectively bond to the bottom layer of the object 404. The cooler the layers are when they come in contact the weaker the adhesive bond between them, thus allowing easier later separation. A reduction in pressure results from the increase in print height 1106, also weakening the adhesive bond between the layers.

In FIG. 11*b*, the bottom layer of the object 1104 has fallen from the height the melted filament was extruded from and now rests on top of the top layer of the support region 1102. This lighter connection will add to the ease of its later detachment.

In FIG. 11*c*, a second layer of the object 1108 is printed at its original height, a height that involves printing directly onto the bottom layer of the object 1104, so that the bottom layer of the object 1104 and the second layer of the object 1108 are stitched together with normal pressure and temperature. In one embodiment, the printing of the second layer of the object 1108 ensures the shape and positioning of the bottom layer of the object 1104. For example, as the top layer of the support 1102 will be relatively cool since its earlier extrusion, its shape and position is relatively fixed. However, in some cases, the bottom layer of the object 1104, having been extruded from an increased print height 1106, may not have completely settled to the same position as if this bottom layer 1104 did not have an increased print height 1106. Accordingly, in these cases, the printing of the second layer of the object 1108 may correct for any unintended variance in height by pressing down the bottom layer of the object 1104 as the second layer of the object 1108 is printed at the originally intended height and position. In this way, a bottom layer of an object 1104 that spans a height greater than intended may be pressed down to correctly meet the top layer of the support 1102 as well as extend no further than a desired position by the printing of the second layer of the object 1104. Consequently, the two layers of the object 1104, 1108 are connected together strongly but the top layer of the support 1102 is only connected barely with the bottom layer of the object 1104. After printing finishes, the user can separate the support and the object very easily and cleanly.

To ensure that the top and bottom layers are easy to detach, the present technique attempts to ensure that: 1) the temperature of the top layer of the support 1102 is low via a print delay time between layers so that the top layer of the support 1102 is cooled down when touching the lower layer of the object 1104; and 2) the pressure printing the second layer of the object 1108 is low so that the bottom layer of the object 1104 is not pushed into the top layer of the support 1102.

Example 1

This example provides for a system for fabricating a three-dimensional (3D) object. The system includes a processor and a system memory comprising code to direct the processor. When executed this code can cause the processor to obtain a 3D model of the 3D object. This code may also cause the processor to compute, for a number of orientations of a 3D model, a volume of a support region used to support overhanging portions of the 3D model during printing. This code can also cause the processor to identify one of the number of orientations of the 3D model as a selected orientation based on the volume of the support region. Further, the code may cause the processor to orient the 3D model according to the selected orientation and print the 3D object. Alternatively, or in addition, the code may increase a print height and a print delay time for a layer of a 3D model printed directly on top of a support region layer. Alternatively, or in addition, the support region may include an internal support for an upper layer of the 3D model if the upper layer is not self-supporting. Alternatively, or in addition, the upper layer of the 3D model is self-supporting if its over-hang angle is less than 45 degrees. Alternatively, or in addition, the code may print an infill section of a layer of a 3D model with a half-edge printing path. Alternatively, or in addition, the code may print a sparse infill section of a layer of a 3D model following a printing path of alternating right-angle turns. Alternatively, or in addition, the 3D model may include a shell and an infill that connects to the shell by replacing a portion of the shell with additional infill. Alternatively, or in addition, the code may start the printing of the 3D object from a concave corner of the layer, or, if the layer lacks concave corners, starting the printing from a random position on the layer.

Example 2

This example provides for a method for fabricating a three-dimensional (3D) object. The method can include obtaining a 3D model of the 3D object. The method may also include computing, for a number of orientations of the 3D model, a volume of a support region used to support overhanging portions of the 3D model during printing. Further the method may include identifying one of the plurality of orientations of the 3D model as a selected orientation based on the volume of the support region. The method can also include orienting the 3D model according to the selected orientation and printing the 3D object. Alternatively, or in addition, the method may include increasing a print height and a print delay time for a layer of a 3D model printed directly on top of a support region layer. Alternatively, or in addition, the support region may include an internal support for an upper layer of the 3D model if the upper layer is not self-supporting. Alternatively, or in addition, the upper layer of the 3D model is self-supporting if its over-hang angle is less than 45 degrees. Alternatively, or in addition, the method may include printing an infill section of a layer of a 3D model with a half-edge printing path. Alternatively, or in addition, the method may include printing a sparse infill section of a layer of a 3D model following a printing path of alternating right-angle turns. Alternatively, or in addition, the 3D model may include a shell and an infill that connects to the shell by replacing a portion of the shell with additional infill. Alternatively, or in addition, the method may include starting the printing of the 3D object from a concave corner of the layer, or, if the layer lacks concave corners, starting the printing from a random position on the layer.

Example 3

This example provides for one or more computer-readable storage medium for storing computer readable instructions that, when executed by one or more processing devices, instruct the fabrication of a 3D object. The computer-readable medium include instructions to obtain a 3D model of the 3D object. The computer-readable medium also include instructions to compute, for a number of orientations of a 3D model, a volume of a support region to support overhanging portions of the 3D model during printing. The computer-readable medium include instructions to identify one of the number of orientations of the 3D model as a selected orientation based on the volume of the support region. Further, the computer-readable medium include instructions to orient the 3D model according to the selected orientation and print the 3D object. Alternatively, or in addition, the instructions may increase a print height and a print delay time for a layer of a 3D model printed directly on top of a support region layer. Alternatively, or in addition, the support region may include an internal support for an upper layer of the 3D model if the upper layer is not self-supporting. Alternatively, or in addition, the upper layer of the 3D model is self-supporting if its over-hang angle is less than 45 degrees. Alternatively, or in addition, the instructions may print an infill section of a layer of a 3D model with a half-edge printing path. Alternatively, or in addition, the instructions may print a sparse infill section of a layer of a 3D model following a printing path of alternating right-angle turns. Alternatively, or in addition, the 3D model may include a shell and an infill that connects to the shell by replacing a portion of the shell with additional infill. Alternatively, or in addition, the instructions may start the printing of the 3D object from a concave corner of the layer, or, if the layer lacks concave corners, starting the printing from a random position on the layer.

Example 4

This example provides for a system for fabricating a three-dimensional (3D) object. The system includes a processor and a system memory comprising code to direct the processor. When executed this code can cause the processor to obtain a 3D model of the 3D object. The code may also increase a print height and a print delay time for a layer of a 3D model printed directly on top of a support region layer and print the 3D object. Alternatively, or in addition, the 3 d model may include a support region and an internal support for an upper layer of the 3D model if the upper layer is not self-supporting. Alternatively, or in addition, the upper layer of the 3D model is self-supporting if its over-hang angle is less than 45 degrees. Alternatively, or in addition, the code may print an infill section of a layer of a 3D model with a half-edge printing path. Alternatively, or in addition, the code may print a sparse infill section of a layer of a 3D model following a printing path of alternating right-angle turns. Alternatively, or in addition, the 3D model may include a shell and an infill that connects to the shell by replacing a portion of the shell with additional infill. Alternatively, or in addition, the code may start the printing of the 3D object from a concave corner of the layer, or, if the layer lacks concave corners, starting the printing from a random position on the layer. Alternatively, or in addition, the code may also cause the processor to compute, for a number of orientations of a 3D model, a volume of a support region used to support overhanging portions of the 3D model during printing. Alternatively, or in addition, the code may also cause the processor to identify one of the number of orientations of the 3D model as a selected orientation based on the volume of the support region. Alternatively, or in addition, the code may cause the processor to orient the 3D model according to the selected orientation.

Example 5

This example provides for a system for fabricating a three-dimensional (3D) object. The system includes a processor and a system memory comprising code to direct the processor. When executed this code can cause the processor to obtain a 3D model of the 3D object. The 3D model may include a support region and an internal support for an upper layer of the 3D model if the upper layer is not self-supporting. When executed the code also will print the 3D object. Alternatively, or in addition, the upper layer of the 3D model is self-supporting if its over-hang angle is less than 45 degrees. Alternatively, or in addition, the code may print an infill section of a layer of a 3D model with a half-edge printing path. Alternatively, or in addition, the code may print a sparse infill section of a layer of a 3D model following a printing path of alternating right-angle turns. Alternatively, or in addition, the 3D model may include a shell and an infill that connects to the shell by replacing a portion of the shell with additional infill. Alternatively, or in addition, the code may start the printing of the 3D object from a concave corner of the layer, or, if the layer lacks concave corners, starting the printing from a random position on the layer. Alternatively, or in addition, the code may also cause the processor to compute, for a number of orientations of a 3D model, a volume of a support region used to support overhanging portions of the 3D model during printing. Alternatively, or in addition, the code may also cause the processor to identify one of the number of orientations of the 3D model as a selected orientation based on the volume of the support region. Alternatively, or in addition, the code may cause the processor to orient the 3D model according to the selected orientation. Alternatively, or in addition, the code may also increase a print height and a print delay time for a layer of a 3D model printed directly on top of a support region layer.

Example 6

This example provides for a system for fabricating a three-dimensional (3D) object. The system includes a processor and a system memory comprising code to direct the processor. When executed this code can cause the processor to obtain a 3D model of the 3D object. The code may also print an infill section of a layer of a 3D model with a half-edge printing path. The code will also print the 3D object. Alternatively, or in addition, the code may print a sparse infill section of a layer of a 3D model following a printing path of alternating right-angle turns. Alternatively, or in addition, the 3D model may include a shell and an infill that connects to the shell by replacing a portion of the shell with additional infill. Alternatively, or in addition, the code may start the printing of the 3D object from a concave corner of the layer, or, if the layer lacks concave corners, starting the printing from a random position on the layer. Alternatively, or in addition, the code may also cause the processor to compute, for a number of orientations of a 3D model, a volume of a support region used to support overhanging portions of the 3D model during printing. Alternatively, or in addition, the code may also cause the processor to identify one of the number of orientations of the 3D model as a selected orientation based on the volume of the support region. Alternatively, or in addition, the code may cause the processor to orient the 3D model according to the selected orientation. Alternatively, or in addition, the code may also increase a print height and a print delay time for a layer of a 3D model printed directly on top of a support region layer. Alternatively, or in addition, the 3D model may include a support region and an internal support for an upper layer of the 3D model if the upper layer is not self-supporting. Alternatively, or in addition, the upper layer of the 3D model is self-supporting if its over-hang angle is less than 45 degrees.

Example 7

This example provides for a system for fabricating a three-dimensional (3D) object. The system includes a processor and a system memory comprising code to direct the processor. When executed this code can cause the processor to obtain a 3D model of the 3D object. The code may print a sparse infill section of a layer of a 3D model following a printing path of alternating right-angle turns. The code will also print the 3D object. Alternatively, or in addition, the 3D model may include a shell and an infill that connects to the shell by replacing a portion of the shell with additional infill. Alternatively, or in addition, the code may start the printing of the 3D object from a concave corner of the layer, or, if the layer lacks concave corners, starting the printing from a random position on the layer. Alternatively, or in addition, the code may also cause the processor to compute, for a number of orientations of a 3D model, a volume of a support region used to support overhanging portions of the 3D model during printing. Alternatively, or in addition, the code may also cause the processor to identify one of the number of orientations of the 3D model as a selected orientation based on the volume of the support region. Alternatively, or in addition, the code may cause the processor to orient the 3D model according to the selected orientation. Alternatively, or in addition, the code may also increase a print height and a print delay time for a layer of a 3D model printed directly on top of a support region layer. Alternatively, or in addition, the 3D model may include a support region and an internal support for an upper layer of the 3D model if the upper layer is not self-supporting. Alternatively, or in addition, the upper layer of the 3D model is self-supporting if its over-hang angle is less than 45 degrees. Alternatively, or in addition, the code may also print an infill section of a layer of a 3D model with a half-edge printing path.

Example 8

This example provides for a system for fabricating a three-dimensional (3D) object. The system includes a processor and a system memory comprising code to direct the processor. When executed this code can cause the processor to obtain a 3D model of the 3D object. The 3D model may include a shell and an infill that connects to the shell by replacing a portion of the shell with additional infill. The code will also print the 3D object. Alternatively, or in addition, the code may start the printing of the 3D object from a concave corner of the layer, or, if the layer lacks concave corners, starting the printing from a random position on the layer. Alternatively, or in addition, the code may also cause the processor to compute, for a number of orientations of a 3D model, a volume of a support region used to support overhanging portions of the 3D model during printing. Alternatively, or in addition, the code may also cause the processor to identify one of the number of orientations of the 3D model as a selected orientation based on the volume of the support region. Alternatively, or in addition, the code may cause the processor to orient the 3D model according to the selected orientation. Alternatively, or in addition, the code may also increase a print height and a print delay time for a layer of a 3D model printed directly on top of a support region layer. Alternatively, or in addition, the 3D model may include a support region and an internal support for an upper layer of the 3D model if the upper layer is not self-supporting. Alternatively, or in addition, the upper layer of the 3D model is self-supporting if its over-hang angle is less than 45 degrees. Alternatively, or in addition, the code may also print an infill section of a layer of a 3D model with a half-edge printing path. Alternatively, or in addition, the code may print a sparse infill section of a layer of a 3D model following a printing path of alternating right-angle turns.

Example 9

This example provides for a system for fabricating a three-dimensional (3D) object. The system includes a processor and a system memory comprising code to direct the processor. When executed this code can cause the processor to obtain a 3D model of the 3D object. The code may start the printing of the 3D object from a concave corner of the layer, or, if the layer lacks concave corners, starting the printing from a random position on the layer. The code will also print the 3D object. Alternatively, or in addition, the code may also cause the processor to compute, for a number of orientations of a 3D model, a volume of a support region used to support overhanging portions of the 3D model during printing. Alternatively, or in addition, the code may also cause the processor to identify one of the number of orientations of the 3D model as a selected orientation based on the volume of the support region. Alternatively, or in addition, the code may cause the processor to orient the 3D model according to the selected orientation. Alternatively, or in addition, the code may also increase a print height and a print delay time for a layer of a 3D model printed directly on top of a support region layer. Alternatively, or in addition, the 3D model may include a support region and an internal support for an upper layer of the 3D model if the upper layer is not self-supporting. Alternatively, or in addition, the upper layer of the 3D model is self-supporting if its over-hang angle is less than 45 degrees. Alternatively, or in addition, the code may also print an infill section of a layer of a 3D model with a half-edge printing path. Alternatively, or in addition, the code may print a sparse infill section of a layer of a 3D model following a printing path of alternating right-angle turns. Alternatively, or in addition, the 3D model may include a shell and an infill that connects to the shell by replacing a portion of the shell with additional infill.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component, e.g., a functional equivalent, even though not structurally equivalent to the disclosed structure, which performs the function in the herein illustrated exemplary aspects of the claimed subject matter. In this regard, it will also be recognized that the innovation includes a system as well as a computer-readable storage media having computer-executable instructions for performing the acts and events of the various methods of the claimed subject matter.

There are multiple ways of implementing the claimed subject matter, e.g., an appropriate API, tool kit, driver code, operating system, control, standalone or downloadable software object, etc., which enables applications and services to use the techniques described herein. The claimed subject matter contemplates the use from the standpoint of an API (or other software object), as well as from a software or hardware object that operates according to the techniques set forth herein. Thus, various implementations of the claimed subject matter described herein may have aspects that are wholly in hardware, partly in hardware and partly in software, as well as in software.

The aforementioned systems have been described with respect to interaction between several components. It can be appreciated that such systems and components can include those components or specified sub-components, some of the specified components or sub-components, and additional components, and according to various permutations and combinations of the foregoing. Sub-components can also be implemented as components communicatively coupled to other components rather than included within parent components (hierarchical).

Additionally, it can be noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but generally known by those of skill in the art.

In addition, while a particular feature of the claimed subject matter may have been disclosed with respect to one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. A system for fabricating a three-dimensional (3D) object, comprising:
   a communications connection to obtain a 3D model of the 3D object;
   a fabrication manager to (i) compute, for a plurality of orientations of the 3D model, a volume of a support region used to support overhanging portions of the 3D model during printing, to (ii) identify one of the plurality of orientations of the 3D model as a selected orientation based on minimizing the volume of the support region relative to the other calculated support region volumes for the plurality of orientations in order to reduce waste, and (iii) to orient the 3D model for printing according to the selected orientation; and
   a controller to direct the printing of the 3D object according to the orientation of the 3D model by the fabrication manager.

2. The system of claim 1, wherein the fabrication manager is to:
   process the 3D model and its support region into layers;
   increase a print height and a print delay time for a layer of the 3D model printed directly adjacent a support region;
   remove an internal support region for an upper layer of the 3D model if the upper layer is self-supporting; and
   generate a printing path for the layers using at least one of a half-edge printing path or path of alternating right-angle turns for a sparse infill section.

3. The system of claim 2, wherein:
   the upper layer of the 3D model is self-supporting if the 3D model has an over-hang angle less than 45 degrees;
   the half-edge printing path adjusts such that the half-edge ends are parallel to the edge of a printing path infill region; and
   the path of alternating right-angle turns are repeated in the sparse infill section to create a rectangular grid.

4. The system of claim 3, wherein:
   the plurality of orientations of the 3D model are based on a convex hull of the 3D model;
   the path of alternating right-angle turns are paired with a rectangular solid infill section; and
   the path of alternating right-angle turns are repeated on a number of layers.

5. The system of claim 1, comprising the 3D model comprises:
   a shell; and
   an infill that connects to the shell by replacing a portion of the shell with additional infill.

6. A method for fabricating a three-dimensional (3D) object, the method comprising:
   obtaining a 3D model of the 3D object;
   computing, for a plurality of orientations of the 3D model, a volume of a support region used to support overhanging portions of the 3D model during printing;
   identifying one of the plurality of orientations of the 3D model as a selected orientation based on minimizing the volume of the support region relative to the other calculated support region volumes for the plurality of orientations in order to reduce waste;
   orienting the 3D model for printing according to the selected orientation; and
   printing the 3D object according to the orientation of the 3D model.

7. The method of claim 6, comprising increasing a print height and a print delay time for a layer of a 3D model printed directly on top of a support region layer.

8. The method of claim 6, wherein the support region comprises an internal support for an upper layer of the 3D model if the upper layer is not self-supporting.

9. The method of claim, 8 wherein the upper layer of the 3D model is self-supporting if its over-hang angle is less than 45 degrees.

10. The method of claim 6, comprising printing an infill section of a layer of a 3D model with a half-edge printing path.

11. The method of claim 6, comprising printing a sparse infill section of a layer of a 3D model following a printing path of alternating right-angle turns.

12. The method of claim 6, wherein the 3D model comprises:
a shell; and
an infill that connects to the shell by replacing a portion of the shell with additional infill.

13. The method of claim 6, comprising starting the printing of the 3D object from a concave corner of the layer, or, if the layer lacks concave corners, starting the printing from a random position on the layer.

14. One or more computer-readable memory storage devices for storing computer readable instructions that, when executed by one or more processing devices, instruct the fabrication of a 3D object, the computer-readable instructions comprising code to:
obtain a 3D model of the 3D object;
compute, for a plurality of orientations of a 3D model, a volume of a support region to support overhanging portions of the 3D model during printing;
identify one of the plurality of orientations of the 3D model as a selected orientation based on minimizing the volume of the support region relative to the other calculated support region volumes for the plurality of orientations in order to reduce waste;
orient the 3D model according to the selected orientation; and
print the 3D object according to the orientation of the 3D model.

15. The one or more computer-readable memory storage devices of claim 14, wherein the 3D model comprises:
a shell of a layer; and
an infill that connects to the shell of a layer by replacing a portion of the shell with additional infill.

16. The one or more computer-readable memory storage devices of claim 14, the computer-readable instructions comprising code to increase a print height and a print delay time for a layer of the 3D model to be printed adjacent a support region layer.

17. The one or more computer-readable memory storage devices of claim 14, wherein the plurality of orientations of the 3D model are based on the number of faces generated by the convex hull of the 3D model.

18. The one or more computer-readable memory storage devices of claim 14, the computer-readable instructions comprising code to remove an internal support region for an upper layer of the 3D model if the upper layer is self-supporting.

19. The one or more computer-readable memory storage devices of claim 14, the computer-readable instructions comprising code to:
generate a printing path for an infill using a half-edge printing path; and
generate a grid by a plurality of printing paths which alternate direction of right-angle turns in a sparse infill section.

20. The one or more computer-readable memory storage devices of claim 19, wherein:
the path of alternating right-angle turns are paired with a rectangular solid infill section; and
the path of alternating right-angle turns are repeated on each layer the sparse infill section is present.

* * * * *

UNITED STATES PATENT AND TRADEMARK OFFICE
CERTIFICATE OF CORRECTION

PATENT NO. : 10,452,053 B2
APPLICATION NO. : 15/323032
DATED : October 22, 2019
INVENTOR(S) : Emmett Lalish et al.

Page 1 of 1

It is certified that error appears in the above-identified patent and that said Letters Patent is hereby corrected as shown below:

In the Claims

Column 21, Line 6, should read as follows:
13. The method of claim 6, comprising starting the printing of the 3D object from a concave corner of a layer, or, if the layer lacks concave corners, starting the printing from a random position on the layer.

Column 22, Line 8, should read as follows:
17. The one or more computer-readable memory storage devices of claim 14, wherein the plurality of orientations of the 3D model are based on the number of faces generated by a convex hull of the 3D model.

Signed and Sealed this
Twenty-sixth Day of November, 2019

Andrei Iancu
*Director of the United States Patent and Trademark Office*